United States Patent [19]

Lee et al.

[11] Patent Number: 5,663,585

[45] Date of Patent: Sep. 2, 1997

[54] DRAM HAVING A BURIED REGION CONTACTED THROUGH A FIELD REGION

[75] Inventors: Chang Jae Lee, Chungcheongbuk-do; Oh Seok Han, Seoul, both of Rep. of Korea

[73] Assignee: LG Semicon Co., Ltd., Chungcheongbuk-do, Rep. of Korea

[21] Appl. No.: 524,286

[22] Filed: Sep. 6, 1995

[51] Int. Cl.$^6$ .................. H01L 29/78; H01L 23/50

[52] U.S. Cl. .................. 257/296; 257/306; 257/382; 257/647

[58] Field of Search .................. 257/296, 298, 257/306, 297, 299, 300, 307, 308, 309, 382, 509, 647, 648

[56] References Cited

U.S. PATENT DOCUMENTS

| | | | |
|---|---|---|---|
| 4,961,095 | 10/1990 | Mashiko | 357/23.6 |
| 5,012,309 | 4/1991 | Nakayama | 357/23.6 |
| 5,014,103 | 5/1991 | Ema | 357/41 |
| 5,172,202 | 12/1992 | Kazuo | 257/306 |

*Primary Examiner*—Tom Thomas
*Assistant Examiner*—David B. Hardy
*Attorney, Agent, or Firm*—Morgan, Lewis and Bockius, LLP

[57] ABSTRACT

A semiconductor memory cell has a semiconductor substrate, an active region disposed on the semiconductor substrate and having two impurity regions, a gate electrode disposed on the active region, a field region isolated from the active region on the semiconductor substrate and having a contract hole, a capacitor disposed over the active region and field region on the semiconductor substrate, and a buried region disposed under the field region and the bit line contacting the first impurity region through the contact hole.

11 Claims, 8 Drawing Sheets

DRAM HAVING A BURIED REGION CONTACTED THROUGH A FIELD REGION

BACKGROUND OF THE INVENTION

1. Field of the Invention

The present invention relates to a semiconductor memory device. More particularly, the present invention relates to a semiconductor memory cell and a manufacturing process thereof having an improved pattern structure of an active region.

2. Discussion of the Related Art

Generally, a DRAM cell in a semiconductor memory device for performing data storage and read out operations is constructed as shown in the equivalent circuit diagram as in FIG. 1. According to FIG. 1 above, a memory cell 100 includes a transistor Q and a capacitor Cs. The gate of the transistor Q is connected to a word line 200, and one of either the source or drain electrode is connected to one terminal of the capacitor Cs while the other electrode is connected to a bit line 300.

The operation of a DRAM as constructed above is described below. First, in the case of a data storage operation, a specified voltage is applied to the word line 200, so that the transistor Q conducts. Next, charge on the bit line 300 is stored in the capacitor Cs and data is thus stored. When data is read out, a specified voltage is applied to the word line 200, so that the transistor Q conducts. Then, charge on the capacitor Cs is read out through the bit line 300.

The layout and structure of a conventional memory cell which operates on the general principles described above is described in reference to FIG. 2 and FIG. 3. FIG. 2 is a two-dimensional layout of a conventional memory Cell. FIG. 3 is a cross-sectional diagram along line III—III of FIG. 2.

A memory cell comprises a MOS transistor and capacitor formed on a silicon substrate 21. An n channel MOS transistor comprises a gate electrode 23 used as a word line and n+ impurity diffusion regions 24 and 25 used as drain and source regions. The n+ impurity diffusion regions 24 and 25 are formed a certain distance apart to limit the channel regions on the silicon substrate 21. The gate electrode 23 is formed on the channel region through a gate oxide layer 22. The capacitor is connected to the n+ impurity diffusion region 24 used as the drain region. The capacitor comprises a storage node 26 connected to the n+ impurity diffusion region 24, and a cell plate 28 formed through a capacitor dielectric layer 27 on the storage node 26. Also, a bit line 31 is connected to the source region 25 through a contact hole 30. In addition, an intermediate dielectric layer 29 is formed between the bit line 31, word line 23, and cell plate 28.

As in the structure above, a capacitor in a conventional memory cell is first formed on an active region, then a bit line is formed above the capacitor. The area of a capacitor thus formed is restricted by the bit line, so that the area the capacitor occupies in a high density integrated memory cell is further reduced. As the capacitor area is decreased, the data reading margin is also reduced, and the cell becomes unstable since data may not be read correctly. Accordingly, for a higher reading margin, it becomes desirable to increase the area of the capacitor occupied by the storage node 26, dielectric layer 27 and cell plate 28.

However, by employing this method, the difference of the capacitor among terminals becomes large, and the aspect ratio of the bit line contact hole 30 increases. Consequently, a void may form in the contact hole when a metal material is deposited for the bit line, thus reducing the cell performance. In addition, difficulties in the processes of contact filling and line patterning also make this method unsuitable for high density integration.

A DRAM cell with a stacked capacitor structure formed above the bit line to increase the area of capacitor has been proposed as described below.

FIG. 4 is a two-dimensional layout of a conventional memory cell with a stacked capacitor structure above the bit line. FIG. 5 is a cross-sectional diagram along line V—V of FIG. 4. According to FIGS. 4 and 5, a gate electrode 43 is formed above a gate oxide layer 42 on a silicon substrate 41 and is used as a word line. First and second impurity diffusion regions 44 and 45 are formed adjacent the gate electrodes 43 at regular intervals on the substrate 41 and are used as source/drain regions. A bit line 47 connects to the first impurity diffusion region 44. This bit line 47 is formed so that it passes over the word line 43. A first intermediate dielectric layer 46 is formed between the word line 43 and the bit line 47. A storage node 49 is formed through a second intermediate dielectric layer 48. The second intermediate dielectric layer 48 is formed above the bit line 47. The storage node 49 is in electrical contact with the second impurity diffusion region 45. A cell plate 51 is formed over a capacitor dielectric layer 50, which is positioned above the storage node 49. As shown in FIG. 4, the active region 52 is situated diagonally with regard to the bit line 47 and the word line 43.

In a structure as described above, the storage node 49 and cell plate 51 may be expanded at the contact region of the bit line 47 and the first impurity diffusion region 44. Consequently, the area of the capacitor is not limited by bit line 47, thus increasing the capacitance. However, since the active region 52 lies diagonally with regard to the bit line 47 and the word line 23, and the ends of the active region 52 take on a bent shape, the memory cell takes on a complicated layout pattern. Therefore, to form separating regions which isolate the plurality of active regions on the substrate, a diagonal pattern becomes necessary, making the manufacturing process more difficult. Also, there are more corners present when forming the pattern due to the diagonal active regions, leading to shrinkage and pattern variability from the proximity effect. Thus, the packing density becomes lower in such a diagonal active pattern. As a result, a memory cell with a conventional stacked capacitor structure above becomes unsuitable as a DRAM cell in a high density integration device.

SUMMARY OF THE INVENTION

The present invention has been made in view of the above circumstances and has as an object to provide a semiconductor memory cell and a manufacturing process thereof suitable for a high density integrated device by improving the active pattern to increase packing density.

A further object of the present invention to provide a semiconductor memory cell and a manufacturing process thereof wherein the cell structure is improved to increase the capacitor area.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor cell of this invention comprises a semiconductor substrate, an active region on the semiconductor substrate and having two impurity regions, a gate electrode disposed on the active region, a field region isolated from the active region on the semiconductor substrate and having a contact hole, a capacitor disposed over the active region and the field region, and a buried region disposed adjacent the contact hole and the bit line contacting the first impurity region through the contact hole.

A manufacturing process of a semiconductor memory cell according to the present invention comprises the steps of providing a semiconductor substrate, forming an active region and a field region on the semiconductor substrate, forming a buried region contacting the active region under the field region, forming a first impurity region and a second impurity region in the active region using the gate electrode as a mask, forming a contact hole in the field region adjacent the buried region, forming a bit line over the field region and the bit line contacting the buried region through the contact hole, and forming a capacitor over the active region and field region such that the capacitor contacts the second impurity region.

These and other objects, features and advantages of the present invention will become more apparent from the following detailed description of a preferred embodiment, when considered in connection with the accompanying figures.

BRIEF DESCRIPTION OF THE ATTACHED DRAWINGS

The accompanying drawings, which are incorporated in and constitute a part of this specification illustrate embodiment(s) of the invention and, together with the description, serve to explain the objects, advantages and principles of the invention. In the drawings, FIG. 1 is an equivalent circuit diagram of a conventional semiconductor memory cell;

DETAILED DESCRIPTION OF THE INVENTION

A preferred embodiment of the present invention will be described below in detail.

As noted above, FIG. 6 is a two-dimensional layout of a plurality of semiconductor memory cells according to the present invention. FIG. 7 is an enlarged two-dimensional layout of a semiconductor memory cell of FIG. 6. FIG. 8 is a cross-sectional diagram of a semiconductor memory cell along line VIII—VIII of FIG. 7.

Figure 1:
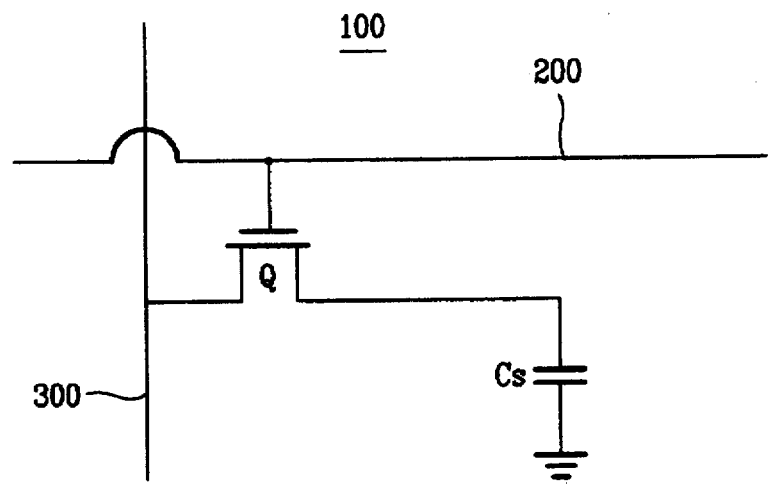
Figure 2:
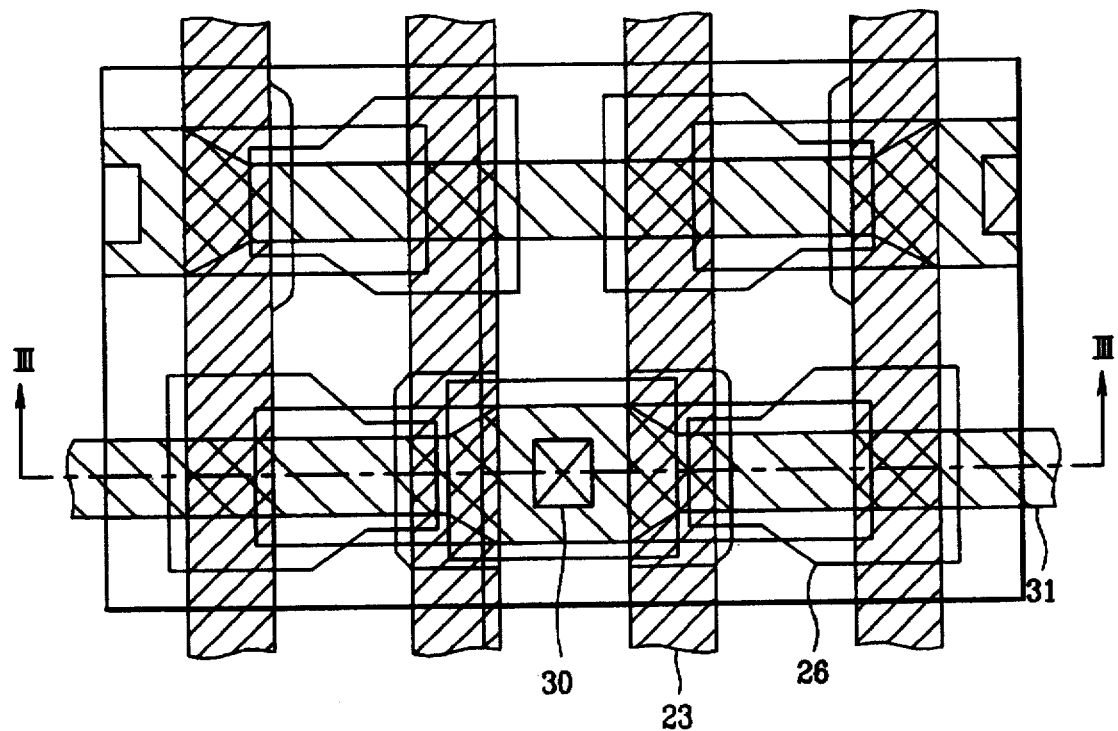
FIG. 2 is a two-dimensional layout of a conventional semiconductor memory cell with a stacked capacitor structure.
Figure 3:
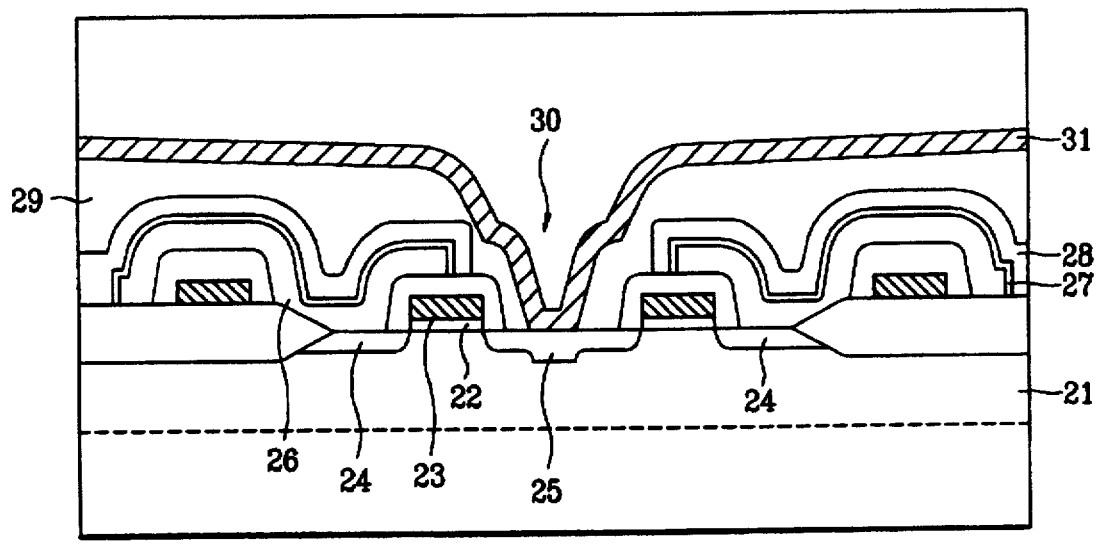
FIG. 3 is a cross-sectional diagram of a memory cell along line III—III of FIG. 2.
Figure 4:
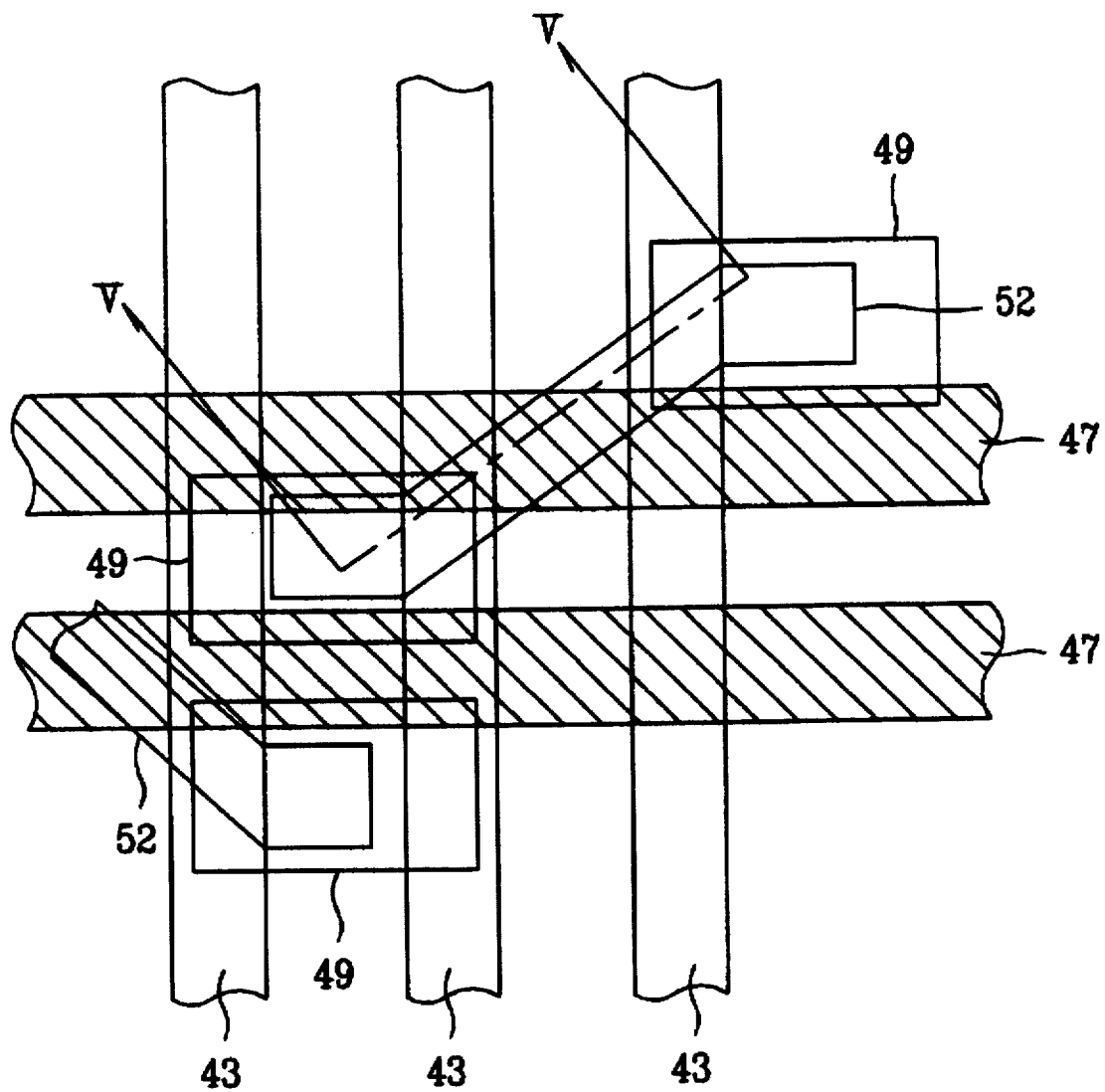
FIG. 4 is a two-dimensional layout of a conventional memory cell with a stacked capacitor structure.
Figure 5:
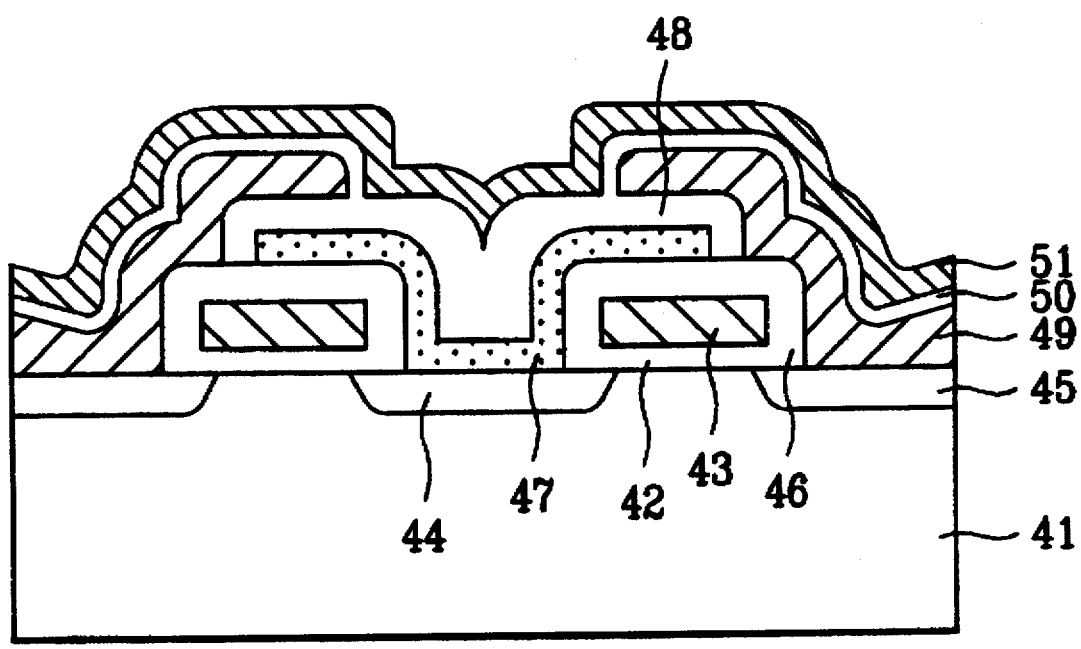
FIG. 5 is a cross-sectional diagram of a memory cell along line V—V of FIG. 4.
Figure 6:
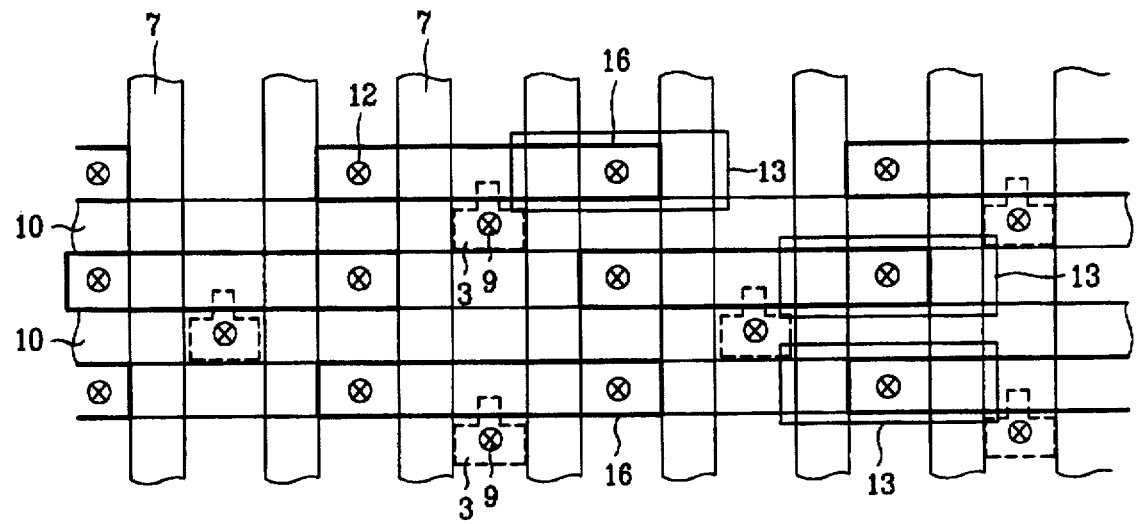
FIG. 6 is a two-dimensional layout of a semiconductor memory device according to the present invention.
Figure 7:
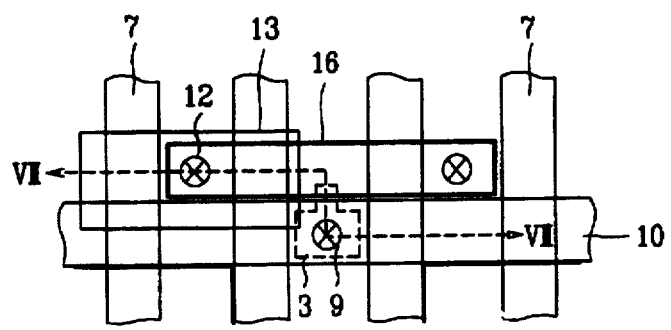
FIG. 7 is an enlarged two-dimensional layout of a memory cell of FIG. 6.
Figure 8:
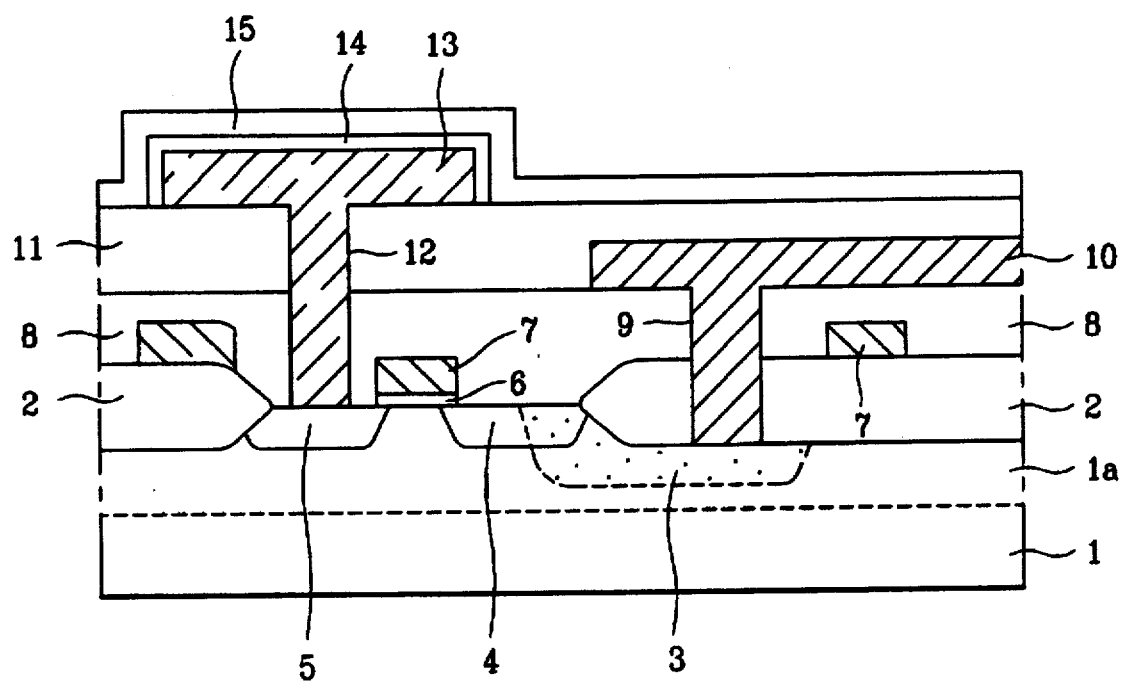
FIG. 8 is a cross-sectional diagram of a memory cell along line VIII—VIII of FIG. 7.

According to FIG. 6 and FIG. 7 above, a plurality of word lines 7 and bit lines 10 are arranged on a semiconductor substrate to cross over each other. Active regions 16 run parallel to the bit lines 10 at regions of intersection with the word lines 7 at regular intervals on the substrate. The active regions 16 are formed with a rectangular shape. And, the active regions 16 can be disposed at least or more four sides. The active region 16 is isolated from a field region 2. Each memory cell is arranged on the active region 16 not overlapping the bit line 10.

FIG. 8 shows a semiconductor memory cell according to the present invention. An active region 16 is disposed on the semiconductor substrate 1 and includes two impurity regions 4, 5. A gate insulating layer 6 and a gate electrode 7 are formed, respectively, on the active region 16. A field region 2 is isolated from the active region 16 on the semiconductor substrate 1 and includes a first contact hole 9. A buried region 3 is disposed adjacent the first contact hole 9 and the bit line contacts the first impurity region 4 through the first contact hole 9. First and second intermediate insulating layers 8, 11 are disposed on the semiconductor substrate 1 and have a second contact hole 12 therethrough. A storage node 13 is disposed on the semiconductor substrate i and has a second contact hole 12 therethrough. Storage node 13 is disposed on the semiconductor substrate 1 and contacts the second impurity region 5 through the second contact hole 12. A dielectric layer 14 and a cell plate 15 are disposed on the storage node 13. Thus, the n channel MOS transistor comprises first and second impurity diffusion regions 4 and 5 used as source and drain regions, and a gate electrode 7 used as a word line. The first and second impurity diffusion regions 4 and 5 are formed at regular intervals on the silicon substrate 1 to limit the channel regions therebetween. Also, bit line 10 is connected to buried region 3 formed below field region 2 through first contact hole 9 formed in the first intermediate dielectric layer 8 and field region 2 which are formed on the gate electrode 7 which is used as a word line. The buried layer 3 is connected to the first impurity diffusion region 4. In addition, the capacitor forming a memory cell along with the transistor is connected to the second impurity diffusion region 5. The capacitor comprises a storage node 13 connected to the second impurity diffusion region 5 and a cell plate 15 formed over a capacitor dielectric layer 14 to cover the storage node 13. In this way, the storage node 13 can be formed up to the upper portion above the bit line formed on the field region 16. The capacitor includes a storage node 13 extending over the gate electrode 7. The storage node 13 is connected to the second impurity diffusion region 5 through the second contact hole 12 formed in the first and second intermediate dielectric layers 8 and 11. The second intermediate dielectric layer 11 is formed above the first intermediate dielectric layer 8.

A manufacturing process for a memory cell according to the present invention with the above structure is described in detail with reference to FIGS. 9A through 9G.

FIGS. 9A through 9G are cross-sectional diagrams illustrating a manufacturing process of a memory cell according to the present invention.

As shown in FIGS. 9A–9G, a method of fabricating a semiconductor memory cell according to the present invention comprises the steps of providing a semiconductor substrate 1, forming an active region 16 and a field region 2 on the semiconductor substrate 1, forming a buried region 3 contacting the active region 16 under the field region 2, forming a gate insulating layer 6 and a gate electrode 7 on the active region 16, forming a first impurity region 4 and a second impurity region 5 in the active region 16 using the gate electrode 7 as a mask, forming a first contact hole 9 in the field region 2 adjacent the buried region 3, forming a bit line 10 over the field region 2 such that the bit line 10 contacts the region 3 through the contact hole 9, forming first and second intermediate insulating layers 8, 11 having a second contact hole 12 on the semiconductor substrate 1, forming a storage node 13 on the semiconductor substrate 1, the storage node 13 contacting the second impurity region 5 through the second contact hole 12, and forming a dielectric layer 14 and a cell plate 15 on the storage node 13.

Figure 9A:
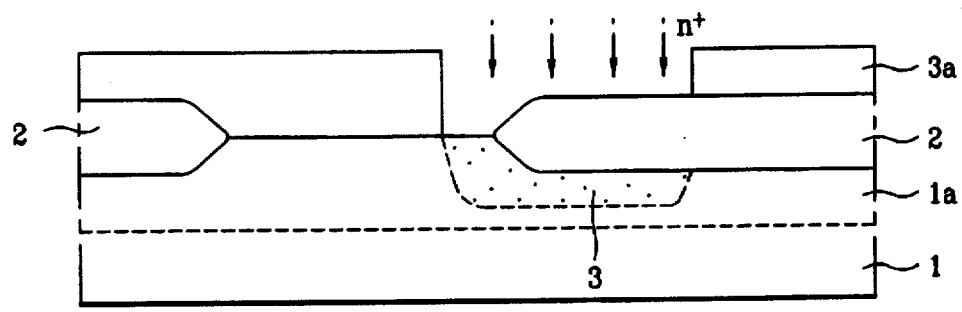
FIGS. 9A through 9G are cross-sectional diagrams illustrating the manufacturing process of a semiconductor memory cell according to this invention.

The method is described in detail, hereinafter. As shown in FIG. 9A, a P well 1a is formed on semiconductor substrate 1 by injecting B+ ions therein. Rectangular active regions 16 and field oxide layer region 2 are formed by photoetching and local oxidation (LOCOS) on the semiconductor substrate 1 where the P well 1a has been formed. Next, a photosensitive layer pattern 3a is deposited to assist in forming a buried layer for connection with a bit line.

Here, the photosensitive layer pattern 3a is formed on field region 2 to slightly overlap the impurity diffusion region 4, which is used as the source region of a transistor. Next, a buried layer 3 is formed below the field region 2 by injecting a high dose of ions to provide sufficient conductivity as the underpath of a bit line. A high ion injection energy is used so that the dopant may be injected through the field region 2.

Figure 9B:
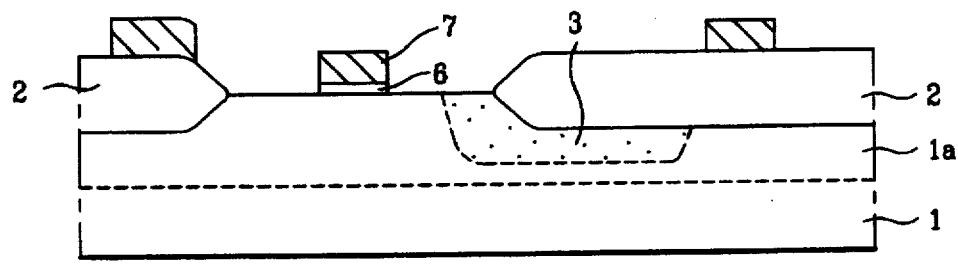

A gate dielectric layer 6 and a gate electrode 7, respectively, are formed over the entire substrate 1 as shown in FIG. 9B.

Figure 9C:
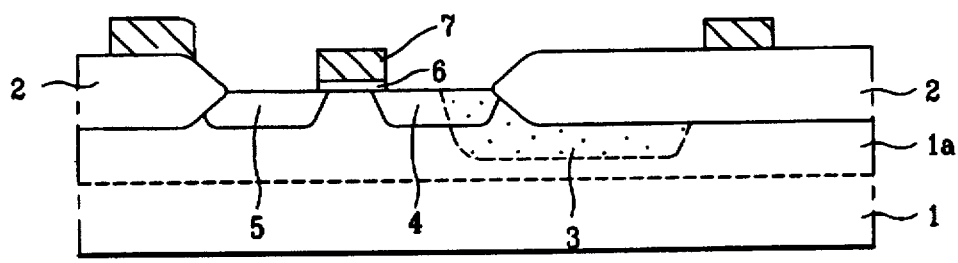

As shown in FIG. 9C, the first and second impurity diffusion regions 4 and 5, or n LDD regions are formed in the active region using the gate electrode 7 as a mask. The impurity diffusion regions 4 and 5 may be formed by injecting an impurity into the active region.

Figure 9D:
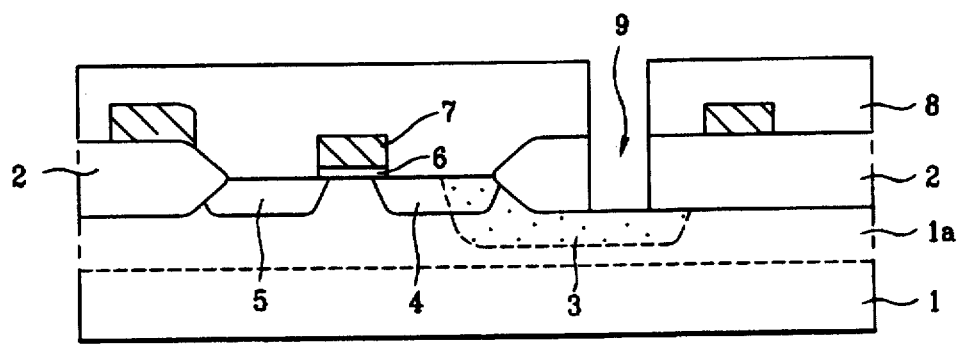

In FIG. 9D, a first intermediate dielectric layer 8 is doped over the entire surface of the substrate 1 and a first line contact hole 9 is formed in the field region 2.

Figure 9E:
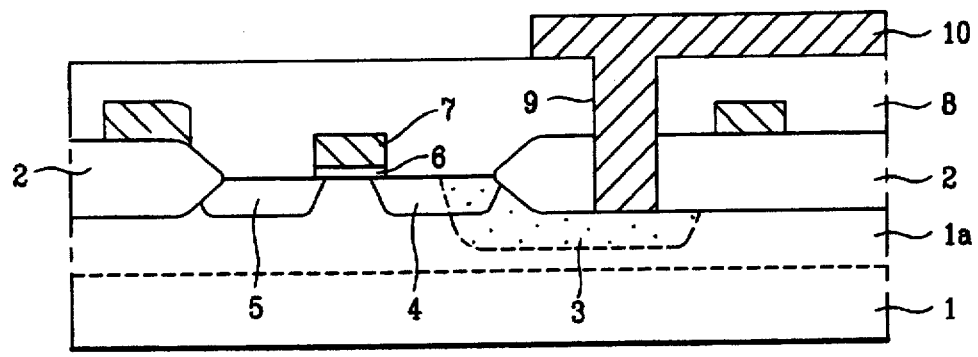

Next, as shown in FIG. 9E, doped polysilicon which is used as a bit line is deposited on the first intermediate dielectric layer 8 including the first contact hole 9. Then, the doped polysilicon is etched according to a specified pattern to form a bit line 10.

Figure 9F:
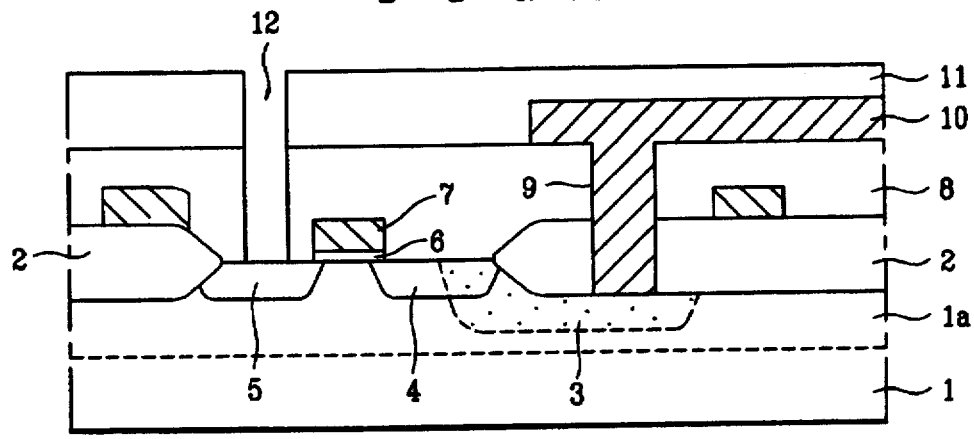

As shown in FIG. 9F, a second intermediate dielectric layer 11 is then formed over the entire surface of the substrate 1. A second contact hole 12 is etched through the second intermediate dielectric layer 11 and the first intermediate dielectric layer 8 according to a specified pattern so that the second impurity diffusion region 5, which is used as the drain region of a transistor, is exposed.

Figure 9G:
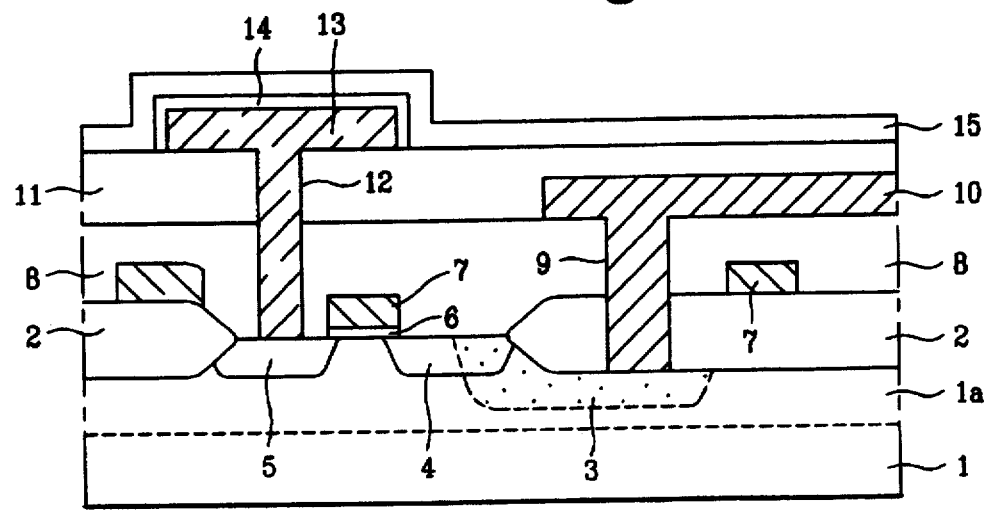

Next, as shown in FIG. 9G, doped polysilicon is deposited over the entire substrate 1 and etched according to a specified pattern to form a storage node 13. Then, a capacitor dielectric layer 14 is formed over the entire surface. Finally, polysilicon is deposited over the capacitor dielectric layer 14 to form a cell plate 15, completing a memory cell.

As described above, a memory cell according to the present invention is connected to the impurity region of the active region through the buried region formed under the field region of the bit line so that the area of capacitor is not limited. A large capacitor area is allowed to thus increase capacitance by connecting the bit line to the source region of the transistor through a buried layer below the field region, making it suitable for high density integration devices. Also, the active region pattern does not overlap the bit lines but runs in parallel, to facilitate the patterning process. Furthermore, the active region pattern is rectangular, so that fewer corners are present, and pattern shrinkage from the proximity effect is reduced. Consequently, packing density is higher than a conventional diagonal active pattern device of the same area, so that high density integration becomes possible.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor memory device comprising:
   a semiconductor substrate;
   first and second impurity regions formed in said semiconductor substrate and spaced apart to define a channel region therebetween;
   a gate electrode formed over the channel region;
   a field region formed on opposite sides of the first and second impurity regions;
   a buried region formed beneath the field region and in electrical contact with said first impurity region;
   a bit line coupled to said buried region through a first contact hole in said field region; and
   a capacitor formed over the gate electrode and coupled to said second impurity region through a second contact hole in said field region.

2. A semiconductor memory cell comprising:
   a semiconductor substrate;
   an active region on the semiconductor substrate and having a first impurity region and a second impurity region;
   a gate electrode disposed over the active region;
   a field region isolated from the active region on the semiconductor substrate and having a first contact hole through the field region;
   a buffed region formed beneath the field region and in electrical contact with the first impurity region;
   a bit line coupled to the buried region through the first contact hole; and
   a capacitor disposed over the active region and the field region and coupled to the second impurity region through a second contact hole.

3. The semiconductor memory cell according to claim 2, wherein the active region has at least four sides.

4. The semiconductor memory cell according to claim 2, wherein the active region has a rectangular shape.

5. The semiconductor memory cell according to claim 2, wherein the capacitor includes an upper portion above the bit line.

6. The semiconductor memory cell according to claim 2, wherein the capacitor includes a storage node extending over the gate electrode.

7. The semiconductor memory cell according to claim 6, the storage node extends over an entire surface of the gate electrode.

8. The semiconductor memory cell according to claim 2, wherein an extension of the active region ends before overlapping the bit line.

9. A semiconductor memory cell comprising:

a semiconductor substrate;

an active region having a rectangular shape on the semiconductor substrate and having a first impurity region and a second impurity region;

a gate insulating layer and a gate electrode disposed on the active region;

a field region isolated from the active region on the semiconductor substrate and having a first contact hole through the field region;

a buried region formed beneath the field region and in electrical contact with the first impurity region;

a bit line coupled to the buried region through the first contact hole;

a first and a second intermediate insulating layers disposed on the semiconductor substrate and having a second contact hole;

a storage node disposed on the semiconductor substrate, the storage node being in contact with the second impurity region through the second contact hole; and a dielectric layer and a cell plate disposed on the storage node.

10. The semiconductor memory cell according to claim 1, wherein the buried region is a highly doped impurity region having a sufficient conductivity as an underpath of the bit line.

11. The semiconductor memory cell according to claim 9, wherein the storage node, the dielectric layer, and the cell plate comprise a capacitor.

* * * * *

UNITED STATES PATENT AND TRADEMARK OFFICE
CERTIFICATE OF CORRECTION

PATENT NO. : 5,663,585
DATED : September 2, 1997
INVENTOR(S) : Lee et al.

It is certified that error appears in the above-identified patent and that said Letters Patent is hereby corrected as shown below:

Column 8, line 11, change "claim 1" to --claim 9--.

Signed and Sealed this

Twenty-ninth Day of December, 1998

Attest:

BRUCE LEHMAN

*Attesting Officer*   *Commissioner of Patents and Trademarks*